(12) United States Patent
Pescod et al.

(10) Patent No.: US 10,090,637 B2
(45) Date of Patent: Oct. 2, 2018

(54) OPTICAL TRANSMITTER

(71) Applicant: BAE Systems plc, London (GB)

(72) Inventors: Christopher Ralph Pescod, Chelmsford (GB); Mohammed Nawaz, Chelmsford (GB)

(73) Assignee: BAE Systems plc, London (GB)

( * ) Notice: Subject to any disclaimer, the term of this patent is extended or adjusted under 35 U.S.C. 154(b) by 0 days.

(21) Appl. No.: 15/515,452

(22) PCT Filed: Oct. 5, 2015

(86) PCT No.: PCT/GB2015/052898
§ 371 (c)(1),
(2) Date: Mar. 29, 2017

(87) PCT Pub. No.: WO2016/059372
PCT Pub. Date: Apr. 21, 2016

(65) Prior Publication Data
US 2017/0222396 A1 Aug. 3, 2017

(30) Foreign Application Priority Data
Oct. 13, 2014 (GB) .................................. 1418066.5

(51) Int. Cl.
*H01S 5/024* (2006.01)
(52) U.S. Cl.
CPC ...... *H01S 5/02415* (2013.01); *H01S 5/02453* (2013.01); *H01S 5/02476* (2013.01)
(58) Field of Classification Search
CPC ............ H01S 5/02415; H01S 5/02453; H01S 5/02476
See application file for complete search history.

(56) References Cited

U.S. PATENT DOCUMENTS

2003/0036303 A1 2/2003 Fang
2005/0091989 A1 5/2005 Leija
(Continued)

FOREIGN PATENT DOCUMENTS

DE 102007039701 A1 3/2008
EP 1096626 A2 * 5/2001
(Continued)

OTHER PUBLICATIONS

Great Britain Search Report of Application No. GB1418066.5, dated Mar. 25, 2015, 4 pages.
Meerstetter Engineering, May 2012, "Thermo Electric Cooling Temperature Controller", Meerstetter Engineering online, available from www.eqphotonics.de/cms/upload/datasheets/5132A.Datasheet_TEC-1122B.pdf, accessed Mar. 25, 2015.
(Continued)

*Primary Examiner* — Dung Nguyen
(74) *Attorney, Agent, or Firm* — Maine Cernota & Rardin

(57) ABSTRACT

An optical transmitter (201) comprising: a laser diode (102) for transmitting an optical signal; a first temperature sensor (106) configured to measure a temperature at or proximate to the laser diode (102); a second temperature sensor (202) configured to measure a temperature of an environment in which the optical transmitter (201) is operating; a thermoelectric device (208) configured to apply heating or cooling to the laser diode (102); and a controller (212) configured to, using the temperature measurements taken by the first temperature sensor (106) and the second temperature sensor (202), control the thermoelectric device (208) to heat or cool the laser diode (102).

14 Claims, 4 Drawing Sheets

(56) References Cited

U.S. PATENT DOCUMENTS

| | | | |
|---|---|---|---|
| 2006/0159141 A1 | 7/2006 | Uchida | |
| 2008/0134689 A1 | 6/2008 | Shen | |
| 2009/0080903 A1 | 3/2009 | Moriyasu | |
| 2010/0095685 A1 | 4/2010 | Johnson | |
| 2013/0218241 A1 | 8/2013 | Savoy et al. | |
| 2014/0072004 A1 | 3/2014 | Connolly | |

FOREIGN PATENT DOCUMENTS

| | | |
|---|---|---|
| EP | 1510253 A1 | 3/2005 |
| GB | 2507732 A | 5/2014 |
| JP | 2000164945 A | 6/2000 |
| JP | 2002232028 A | 8/2002 |
| JP | 2002344065 A1 | 11/2002 |
| WO | 2013165514 A2 | 11/2013 |

OTHER PUBLICATIONS

International Search Report of Application PCT/GB2015/052898, dated Feb. 2, 2016, 3 pages.
R.D. Harvey et al: "Distributed Control to Improve Performance of Thermoelectric Coolers", Heat Transfer, vol. 2, vol. 2004, 2004, pp. 197-201, XP055245975, DOI: 10.1115/IMECE2004-59859, ISBN: 978-0-7918-4711-4, p. 1,3,13,31, fig. 10.
International Search Report and Written Opinion of Application No. PCT/GB2015/052899, dated Feb. 16, 2016, 14 pages.
Great Britain Search Report of Application No. GB1418063.2, dated Mar. 30, 2015, 4 pages.
International Preliminary Report on Patentability of Application No. PCTGB2015052899, dated Apr. 18, 2017, 10 pages.
International Preliminary Report on Patentability of Application No. PCTGB2015052898, dated Apr. 18, 2017, 9 pages.

\* cited by examiner

OPTICAL TRANSMITTER

RELATED APPLICATIONS

This application is a National Phase application filed under 35 USC § 317 of PCT Application No. PCT/GB2015/052898 with an international filing date of Oct. 5, 2015 which claims priority of GB Patent Application 1418066.5 filed Oct. 13, 2014. Each of these applications is herein incorporated by reference in its entirety for all purposes.

FIELD OF THE INVENTION

The present invention relates to optical transmitters and the operation thereof.

BACKGROUND

Laser diodes, or laser diode chips, are used extensively in optical fibre communications optical transmitters due to their high power, low noise and ability to be modulated directly or indirectly at high data rates or microwave frequencies. Typically, the temperature of a laser diode chip is maintained within a specified temperature range (for example, 0° C. to 30° C.) in order to provide long life and reliability, and also to stabilise the light output versus bias current operating point and relative intensity noise.

Many optical transmitters used in military systems are required to operate over a wider temperature range (for example, −50° C. to 90° C.). To maintain the laser diode chip within its specified temperature range, a thermoelectric device, for example a Peltier cooler, may be used to maintain the temperature of the laser diode chip while the external ambient temperature varies.

A Peltier cooler is able to operate with a temperature differential between relatively cold and hot surfaces of typically +/−60° C. Multiple stage Peltier coolers are able to operate with an increased temperature differential, but at the expense of reduced power supply efficiency and dissipated power that is to be removed by a heat sink. Furthermore, there tends to be a reduction in the reliability of the Peltier cooler.

FIG. 1 is a schematic illustration (not to scale) showing an optical or laser transmitter 101 in which a conventional temperature controlled laser diode chip 102 mounted within a laser package 104 is implemented.

The laser package 104 comprises the laser diode chip 102 and a temperature sensor 106 that are mounted in close proximity on a Peltier cooler 108. The laser diode chip 102 outputs an optical signal via an optical fibre 109. The laser package 104 is mounted onto to a heat sink 110. By applying an appropriate polarity bias current to the Peltier cooler 108, the laser diode chip 102 of the laser package 104 can be either cooled or heated.

An electrical temperature controller 112 varies a current through the Peltier cooler 108 (via first electrical connections 114). This current through the Peltier cooler 108 is varied until a voltage that is dependent upon a temperature of the laser diode chip 102 (which is hereinafter referred to as the "laser diode chip temperature voltage" and is derived by the temperature controller 112 from the temperature sensor 106 via second electrical connections 116) matches, i.e. equals, a reference voltage that fixed by a fixed reference voltage module 118. The fixed reference voltage module 118 provides the fixed reference voltage to the temperature controller 112 via third electrical connections 120.

The reference voltage specified by the fixed reference voltage module 118 is normally fixed during construction and testing of the laser transmitter 101 and corresponds to a single particular temperature for the laser diode chip 102. This single temperature for the laser diode chip 102 tends to be permanently set or fixed within the laser diode chip 102 and tends to be within a 0° C. to 30° C. range, typically 20° C.

For a +/−60° C. Peltier cooler control range and a 20° C. set temperature, the temperature controller 112 tends to allow the laser transmitter 101 to operate over a 20° C.+/−60° C. ambient temperature range (i.e. between −40° C. and 80° C.).

SUMMARY OF THE INVENTION

In a first aspect, the present invention provides an optical transmitter comprising: a laser diode for transmitting an optical signal; a first temperature sensor configured to measure a temperature at or proximate to the laser diode; a second temperature sensor configured to measure a temperature of an environment in which the optical transmitter is operating (i.e., an ambient temperature at a location that is remote from the laser diode); a thermoelectric device configured to apply heating or cooling to the laser diode; and a controller configured to, using the temperature measurements taken by the first temperature sensor and the second temperature sensor, control the thermoelectric device to heat or cool the laser diode.

The thermoelectric device may be a Peltier effect semiconductor heat transfer system.

The controller may be configured to control the thermoelectric device to heat or cool the laser diode based upon a comparison between a first parameter value and a second parameter value, the first parameter value being dependent upon temperature measurements taken by the first temperature sensor, the second parameter value being dependent upon temperature measurements taken by the second temperature sensor.

The optical transmitter may further comprise a heat sink coupled to the thermoelectric device and configured to, when the thermoelectric device is controlled to heat the laser diode, draw heat from the environment, and when the thermoelectric device is controlled to cool the laser diode, dissipate heat into the environment.

The second temperature sensor may be positioned at or proximate to an interface between the heat sink and the environment.

The controller may include a variable reference signal module configured to generate a first signal, the first signal being dependent upon a temperature measurement taken by the second temperature sensor.

The controller may include a comparator configured to compare the first signal to a second signal, the second signal being dependent upon a temperature measurement taken by the first temperature sensor.

The controller may be configured to control the thermoelectric device based upon a comparison between the first signal and the second signal.

The thermoelectric device may comprises a plurality of independently controllable heat transfer elements. The controller may be configured to control the plurality of heat transfer elements independently of each other.

Each heat transfer element may comprise at least one semiconductor element pair arranged to yield Peltier effect heat transfer, each semiconductor element pair comprising a P-doped semiconductor element and an N-doped semiconductor element.

The controller may be configured to control the heat transfer elements based on a footprint of the laser diode on the thermoelectric device.

The controller may be configured to control the heat transfer elements based on a temperate measurement taken by the second temperature sensor.

The controller may include: a variable reference signal module configured to generate a first signal, the first signal being dependent upon a temperature measurement taken by the second temperature sensor; and a plurality of comparators, each comparator being configured to compare the first signal to a second signal, the second signal being dependent upon a temperature measurement taken by the first temperature sensor. Each comparator may be configured to control a respective heat transfer element of the thermoelectric device based upon a comparison between the first signal and the second signal.

The controller may include a comparator activation/deactivation module configured to activate or deactivate the comparators based on a temperate measurement taken by the second temperature sensor.

The optical transmitter may further include, for each heat transfer element, a current sensor for measuring a current through that heat transfer element.

The controller may be configured to control the heat transfer elements depending upon measurements taken by one or more of the current sensors.

The optical transmitter may further comprise a heat spreader disposed between the laser diode and the thermoelectric device.

In a further aspect, the present invention provides a method of operating an optical transmitter, the optical transmitter comprising a laser diode for transmitting an optical signal, the method comprising: measuring, by a first temperature sensor, a temperature at or proximate to the laser diode; measuring, by a second temperature sensor, a temperature of an environment in which the optical transmitter is operating; and, using the temperature measurements taken by the first temperature sensor and the second temperature sensor, controlling, by a controller, a thermoelectric device to heat or cool the laser diode.

DETAILED DESCRIPTION

Figure 2:
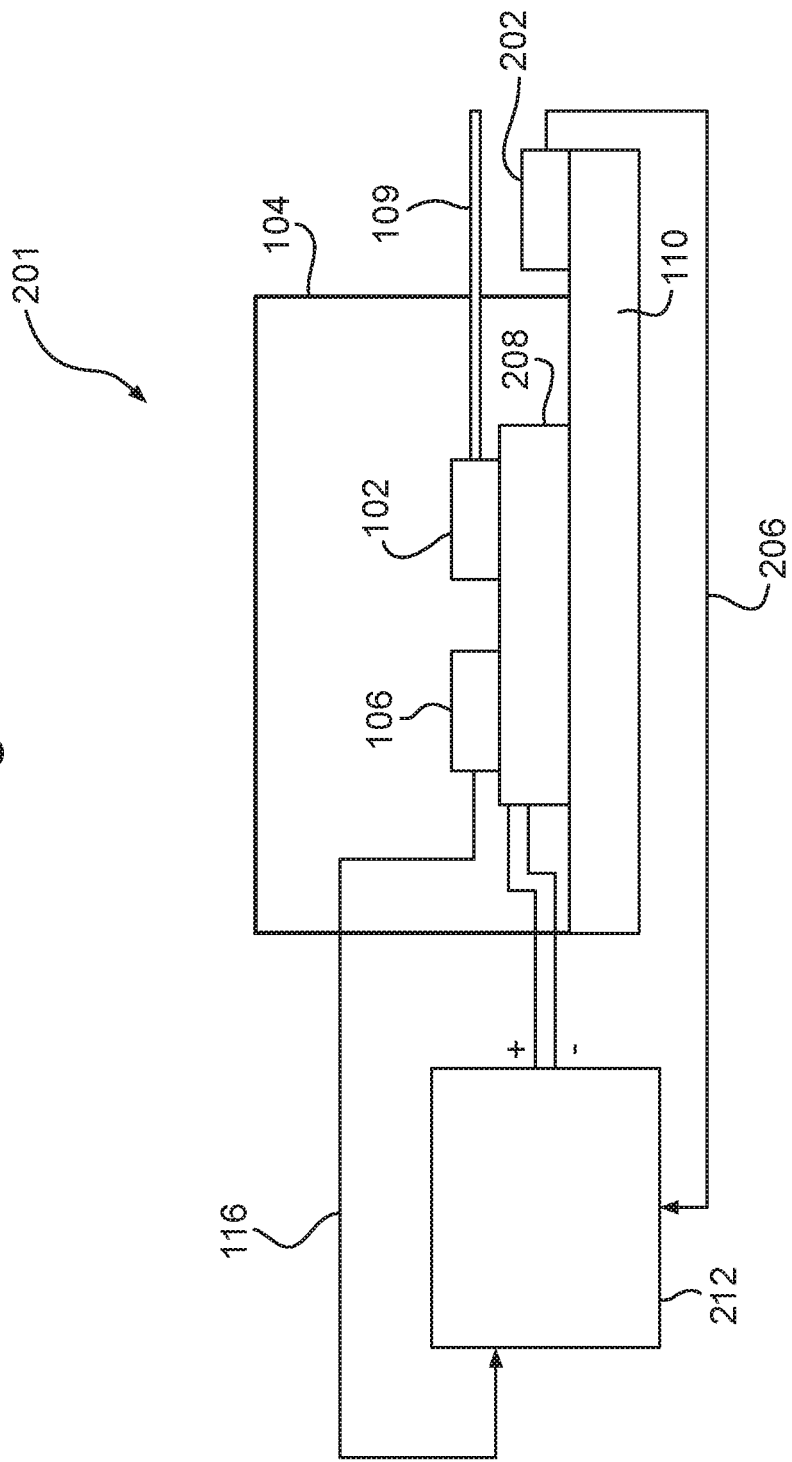
FIG. 2 is a schematic illustration (not to scale) of an embodiment of an improved laser transmitter.

FIG. 2 is a schematic illustration (not to scale) of an embodiment of a laser transmitter, hereinafter referred to as the "further laser transmitter" 201.

Figure 1:
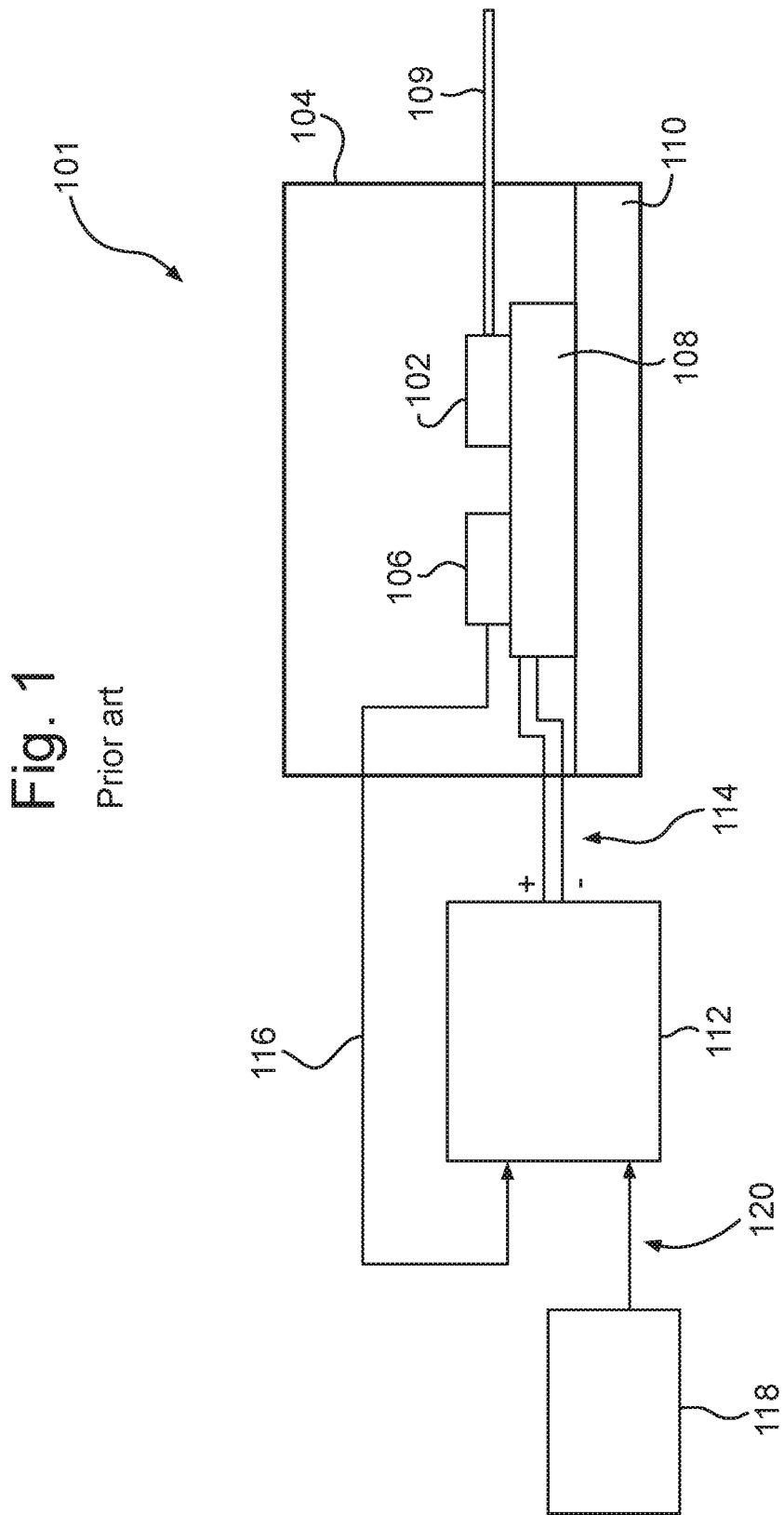
FIG. 1 is a schematic illustration (not to scale) showing a conventional laser transmitter.

The further laser transmitter 201 comprises a laser package 104 including a laser diode chip 102 and a temperature sensor 106 mounted in close proximity on a heat transfer device 208, a heat sink 110 on which the laser package 104 is mounted, and controller 212, which are coupled together in an equivalent way to that described in more detail earlier above with reference to FIG. 1.

In this embodiment, the heat transfer device 208 is a Peltier effect semiconductor heat transfer system configured to yield Peltier effect heat transfer. An embodiment of the heat transfer device 208 is described in more detail later below with reference to FIGS. 3 and 4.

In this embodiment, the further laser transmitter 201 further comprises a further temperature sensor 202 which is coupled directly to the controller 212.

In some embodiments, the further laser transmitter 201 may comprise an aluminium nitride (AlN) carrier and/or a heat spreader, for example, disposed between the heat transfer device 208 and the laser diode chip 102/temperature sensor 106.

The further temperature sensor 202 is mounted on the heat sink 110 external to the laser package 104.

The further temperature sensor 202 is configured to measure the heat sink ambient temperature which is determined by the thermal environment around the heat sink 110. When heat is transferred to the heat sink 110 from the heat transfer device 208, the temperature of the environment to which the heat sink 110 is dissipated tends to increase. Alternatively, when heat is transferred from the heat sink 110 to the heat transfer device 208, the temperature of the environment from which the heat sink 110 draws heat will tend to decrease. The change in the temperature of the heat sink 110 is dependent on the heat dissipated by the laser diode chip 102 and the heat transfer device 208, and also on the heat capacity of the heat sink 110. Thus, in this embodiment, the further temperature sensor 202 measures the ambient temperature of the environment in which the further laser transmitter 201 is operating.

In operation, temperature measurements taken by the further temperature sensor 202 are sent, from the further temperature sensor 202, to the controller 212 via a fourth electrical connection 206. The controller 212 is configured to, as described in more detail later below with reference to Figures 3 and 4, control operation of the heat transfer device 208 to provide heating or cooling to the laser diode chip 102.

Figure 3:
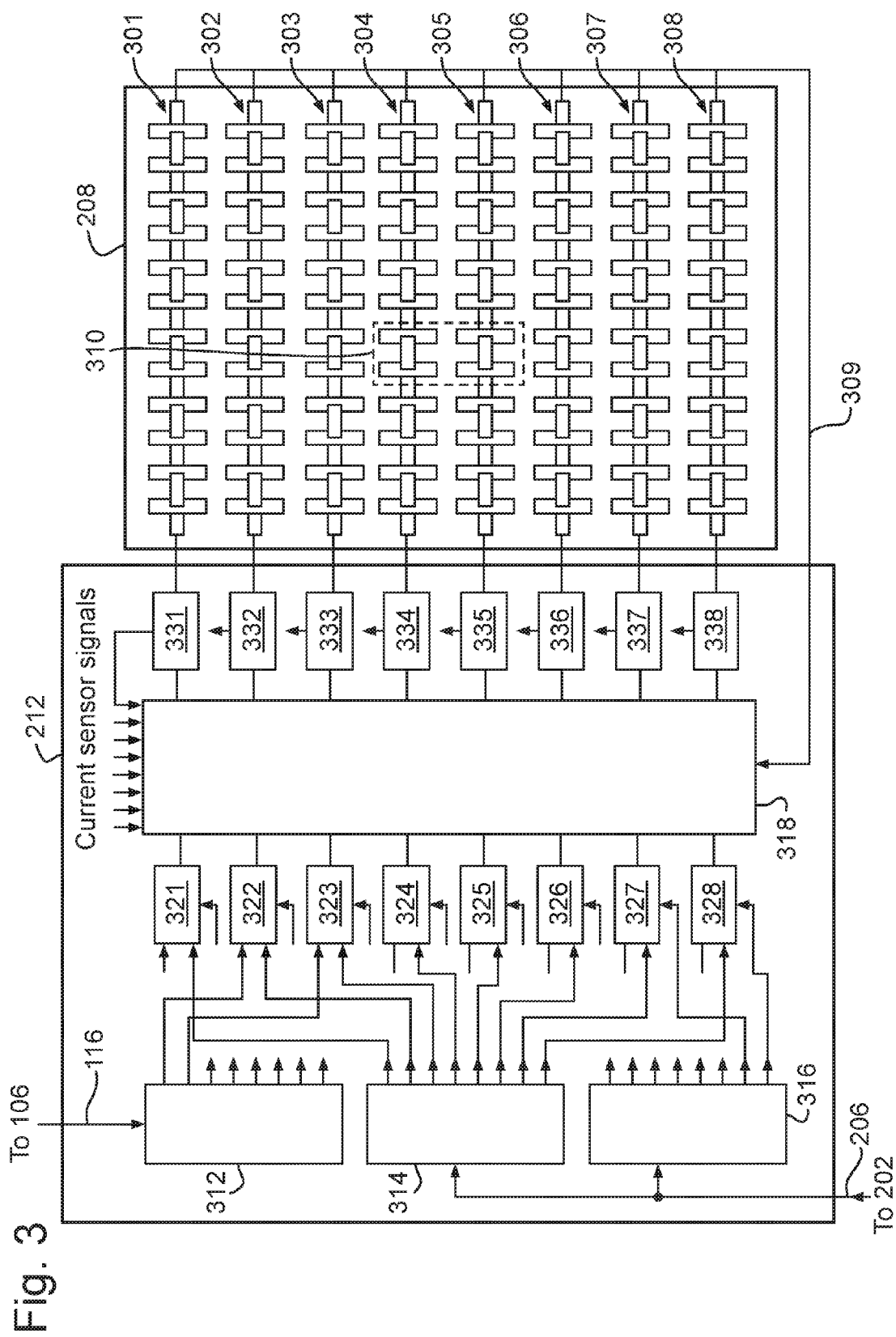
FIG. 3 is a schematic illustration (not to scale) showing a heat transfer device and controller of the improved laser transmitter.

FIG. 3 is a schematic illustration (not to scale) showing a top down view of the heat transfer device 208 and the illustrating the coupling of the heat transfer device 208 to the controller 212.

In this embodiment, the heat transfer device 208 comprises eight rows of P/N doped junctions, namely a first row 301, a second row 302, a third row 303, a fourth row 304, a fifth row 305, a sixth row 306, a seventh row 307, and an eighth row 308.

Figure 4:
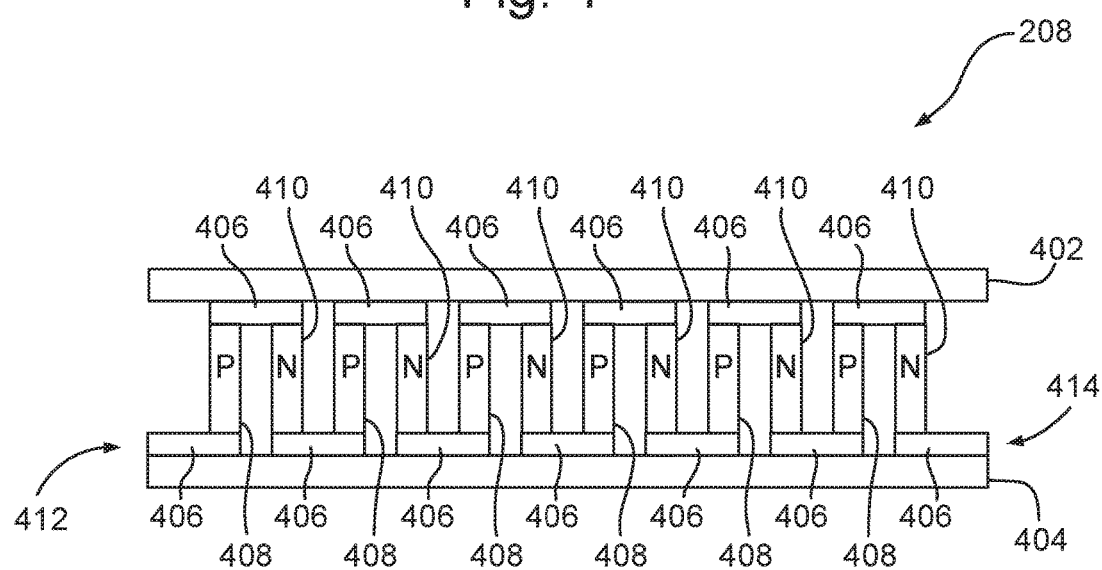
FIG. 4 is a schematic illustration (not to scale) showing a side view cross-section of the heat transfer device.

FIG. 4 is a schematic illustration (not to scale) showing a side view cross-section of the heat transfer device 208 taken through one of the rows of P/N doped junctions.

In this embodiment, the heat transfer device 208 comprises a first ceramic plate 402 and a second ceramic plate 404. Also, each row of P/N doped junctions 301-308 comprises a plurality of copper connections 406, sections of P-doped semi-conductor material 408 (i.e. P doped junctions), and sections of N-doped semi-conductor material 410 (i.e. N doped junctions).

In this embodiment, the sections of semiconductor material 408, 410 are positioned thermally in parallel to each other and electrically in series, in an alternating P-type and N-type arrangement. The alternating P-doped semi-conductor material 408 and N-doped semi-conductor material 410 are electrically connected in series by the copper connections 406. The upper side of the rows of P/N doped junctions 301-308 are thermally coupled to the first ceramic plate 402.

The lower side of the rows of P/N doped junctions 301-308 are thermally coupled to the second ceramic plate 404. Thus, the rows of P/N doped junctions 301-308 are sandwiched between the first ceramic plate 402 and the second ceramic plate 404.

The first and second ceramic plates 402, 404 electrically insulate the copper connections 406 between the P/N junctions 408, 410 from the laser diode chip 102 and temperature sensor 106 mounted on the upper surface of the first ceramic plate 402, and from the heat sink 110 coupled to the second ceramic plate 404. Advantageously, an AlN carrier/heat spreader disposed between the laser diode chip 102 and the first ceramic plate 402 would tend to increase the lateral heat flow for heat generated by the laser diode chip 102. This will tend to result in a reduced thermal resistance between the laser diode chip 102 and the heat sink 110. Also, use of such an AlN carrier/heat spreader will tend to provide that the outer P/N-doped junction rows 301, 302, 303, 306, 307 and 308 (i.e. the rows that are not overlapped by the laser diode chip 102) will be more efficient in transferring heat between the laser diode chip 102 and the heat sink 110.

In use, a voltage is applied across the free ends 412, 414 of one or more of the rows of P/N doped junctions 301-308, thereby causing a direct current to flow through that row of P/N doped junctions 301-308. In this embodiment, the rows of P/N doped junctions 301-308 are coupled to the controller 212 by a common power supply connection 309.

Depending on the direction of current flow, the current flowing through the heat transfer device 208 causes either:
heat to be transferred from the first ceramic plate 402 to the second ceramic plate 404 and subsequently dissipated into the environment by the heat sink 110, thereby cooling to the laser diode chip 102; or
heat to be transferred from the second ceramic plate 404 to the first ceramic plate 402, thereby drawing heat from the environment via the heat sink 110 and providing heating to the laser diode chip 102.

Thus, in this embodiment, the heat transfer device 208 may be controlled by the controller 212 to operate in one of two modes of operation. In a first mode of operation, the first ceramic plate 402 is a relatively "cool" surface of the heat transfer device 208 from which heat is transferred away. Also in the first mode of operation, the second ceramic plate 404 forms a "hot" surface of the heat transfer device 208 to which heat is transferred and is subsequently dissipated by the heat sink 110. In a second mode of operation, the first ceramic plate 402 is a relatively "hot" surface to which heat is transferred. Also in the second mode of operation, the second ceramic plate 404 forms a "cool" surface of the heat transfer device 208 away from which heat is transferred in the direction of the first ceramic plate 402.

A footprint of the laser diode chip 102 on the upper surface of the heat transfer device 208 is indicated in FIG. 3 by a dotted line and the reference numeral 310. In this embodiment, the footprint 310 of the laser diode chip 102 overlaps only the fourth row 304 and the fifth row 305 of P/N doped junctions, and does not overlap the remaining rows of P/N doped junctions 301-303, 306-308.

In this embodiment, within the heat transfer device 208, the rows of P/N doped junctions 301-308 are electrically isolated from one another.

In this embodiment, the controller 212 is configured to control each of the rows of P/N doped junctions 301-308 separately from one another. In other words, the controller 212 may cause a direct current to flow, in either direction, through each of the rows of P/N doped junctions 301-308 independently of each of the other rows of P/N doped junctions 301-308. Thus, by selectively activating (i.e. causing a current to flow through) different rows of P/N doped junctions 301-308, and by selecting a current direction through each of those rows of P/N doped junctions 301-308, the cooling/heating effect to the first ceramic plate 402 may be varied.

Switching between heating and cooling may be achieved by reversing the direction of current flow through the heat transfer device 208 (for example, through one or more of the rows 301-308).

In this embodiment, the controller 212 comprises a buffer 312, a first look-up module 314, a second look-up module 316, and a differential power supply module 318. The controller 212 further comprises, for each row of P/N doped junctions 301-308 of the heat transfer device 208, a respective comparator 321-328 (namely, a first comparator 321, a second comparator 322, a third comparator 323, and so on). The controller 212 further comprises, for each row of P/N doped junctions 301-308 of the heat transfer device 208, a respective current sensor 331-338 (namely, a first current sensor 331, a second current sensor 332, a third current sensor 333, and so on).

The buffer 312 is configured to receive the laser diode chip temperature voltage derived from temperature measurements taken by the temperature sensor 106.

In this embodiment, the ambient temperature sensor voltage derived from temperature measurements taken by the further temperature sensor 202 is split, so that that signal is received by both the first look-up module 314 and the second look-up module 316.

In this embodiment, the first look-up module 314 is configured to provide a reference signal to be used by the comparators 321-328. The first look-up module 314 comprises a look-up table having a plurality of different input temperatures or input temperature ranges and, for each input temperature/range, a corresponding output temperature. In operation, the first look-up module 314 receives, as an input temperature, an ambient temperature measurement taken by the further temperature sensor 202. The first look-up module 314 looks-up the received input temperature in its look-up table, and determines a corresponding output temperature. The first look-up module 314 then sends a signal specifying the determined output temperature (i.e. the reference voltage) to each of the comparators 321-328.

In some embodiments, an output temperature is not determined and instead the first look-up module 314 may instead determine a voltage for the output signal. In other words, in some embodiments the look-up table of the first look-up module 314 comprises a plurality of different input temperatures or input temperature ranges and, for each input temperature/range, a corresponding (e.g. different) output reference voltage.

In this embodiment, the reference voltage output by the first look-up module 314 is variable, i.e. not fixed. The reference voltage output by the first look-up module 314 is dependent upon the input voltage received from the further temperature sensor 202, with different input voltages corresponding to different output reference voltages. Thus, the reference voltage output by the first look-up module 314 is dependent upon the temperature measured by the further temperature sensor 202. This is in contrast to the conventional reference voltage used in the conventional laser transmitter 101 described in more detail earlier above with reference to FIG. 1, in which the reference voltage specified by the fixed reference voltage module 118 is fixed, i.e. not variable.

In this embodiment, the reference voltage output by the first look-up module 314 may be varied to specify any temperature for the laser diode chip 102 within the range 0° C. to 30° C. This tends to be in contrast to the conventional laser transmitter 101 in which the reference voltage is fixed to specify only a single temperature, for example 20° C.

In this embodiment, the look-up table of the first look-up module 314 specifies that ambient temperature measurements of between −40° C. to 80° C. correspond to an output reference voltage that specifies a temperature for the laser diode chip 102 of 20° C. In other words, in response to receiving ambient temperature measurements between −40° C. to 80° C., the first look-up module 314 sends, to the comparators 321-328, a signal specifying a temperature of 20° C. When the laser diode chip 102 is set at a temperature of 20° C., for a +/−60° C. control range, the further laser transmitter 201 may operate over a 20° C. +/−60° C. ambient temperature range (i.e. between −40° C. and 80° C.).

In this embodiment, the look-up table of the first look-up module 314 specifies that ambient temperature measurements of between −50° C. to −40° C. correspond to an output reference voltage that specifies a temperature for the laser diode chip 102 of 10° C. In other words, in response to receiving ambient temperature measurements between −50° C. to −40° C., the first look-up module 314 sends, to the comparators 321-328, a signal specifying a temperature of 10° C. When the laser diode chip 102 is set at a temperature of 10° C., for a +/−60° C. Peltier cooler control range, the further laser transmitter 201 may operate over a 10° C.+/−60° C. ambient temperature range (i.e. between −50° C. and 70° C.).

In this embodiment, the look-up table of the first look-up module 314 specifies that ambient temperature measurements of between −60° C. to −50° C. correspond to an output reference voltage that specifies a temperature for the laser diode chip 102 of 0° C. In other words, in response to receiving ambient temperature measurements between −60° C. to −50° C., the first look-up module 314 sends, to the comparators 321-328, a signal specifying a temperature of 0° C. When the laser diode chip 102 is set at a temperature of 0° C., for a +/−60° C. Peltier cooler control range, the further laser transmitter 201 may operate over a 0° C.+/−60° C. ambient temperature range (i.e. between −60° C. and 60° C.).

In this embodiment, the look-up table of the first look-up module 314 specifies that ambient temperature measurements of between 80° C. to 90° C. correspond to an output reference voltage that specifies a temperature for the laser diode chip 102 of 30° C. In other words, in response to receiving ambient temperature measurements between 80° C. to 90° C., the first look-up module 314 sends, to the comparators 321-328, a signal specifying a temperature of 30° C. When the laser diode chip 102 is set at a temperature of 30° C., for a +/−60° C. Peltier cooler control range, the further laser transmitter 201 may operate over a 30° C.+/−60° C. ambient temperature range (i.e. between −30° C. and 90° C.).

In this embodiment, the second look-up module 316 is configured to provide, to each of the comparators 321-328, a respective control signal. A control signal for a comparator 321-328 either enables or disables that comparator 321-318, as described in more detail later below. The second look-up module 316 comprises a look-up table having a plurality of different input temperatures or input temperature ranges and, for each input temperature/range, a set of control signals for the comparators 321-328. In operation, the second look-up module 316 receives, as an input temperature, an ambient temperature measurement taken by the further temperature sensor 202. The second look-up module 316 looks-up the received input temperature in its look-up table, and determines a corresponding set of control signals which includes a respective control signal for each of the comparators 321-328. The second look-up module 316 then sends each of the control signals in the determined set of control signals to the corresponding comparator 321-328.

In this embodiment, the look-up table of the second look-up module 316 specifies that ambient temperature measurements of between 0° C. and 40° C. correspond to a set of control signals that includes "enable" (or "on") signals for only the fourth and fifth comparators 324, 325, and also includes "disable" (or "off") signals for the other comparators 321-323, 326-328. In other words, in response to receiving ambient temperature measurements between 0° C. and 20° C., the second look-up module 316 sends "enable" signals to fourth and fifth comparators 324, 325 (which are used to control operation of the fourth and fifth rows 304, 305 of the heat transfer device 208 respectively), and also sends "disable" signals to the first, second, third, sixth, seventh, and eighth comparators 321-323, 326-328 (which are used to control operation of the first, second, third, sixth, seventh, and eighth rows 301-303, 306-308 of the heat transfer device 208 respectively).

In this embodiment, the look-up table of the second look-up module 316 specifies that ambient temperature measurements of between −20° C. and 0° C., or between 40° C. and 60° C., correspond to a set of control signals that includes "enable" (or "on") signals for only the third, fourth, fifth, and sixth comparators 323-326, and also includes "disable" (or "off") signals for the other comparators 321, 322, 327, 328. In other words, in response to receiving ambient temperature measurements between −20° C. and 0° C. or between 40° C. and 60° C., the second look-up module 316 sends "enable" signals to the third, fourth, fifth, and sixth comparators 323-326 (which are used to control operation of the third, fourth, fifth, and sixth rows 303-306 of the heat transfer device 208 respectively), and also sends "disable" signals to the first, second, seventh, and eighth comparators 321, 322, 327, 328 (which are used to control operation of the first, second, seventh, and eighth rows 301, 302, 307, 308 of the heat transfer device 208 respectively).

In this embodiment, the look-up table of the second look-up module 316 specifies that ambient temperature measurements of less than −20° C., or greater than 60° C., correspond to a set of control signals that includes "enable" (or "on") signals for all of the comparators 321-328, and no "disable" (or "off") signals. In other words, in response to receiving ambient temperature measurements that are less than −20° C. or greater than 60° C., the second look-up module 316 sends "enable" signals to all of the comparators 321-328.

In this embodiment, each of the comparators 321-328 is used to control a respective row of P/N-doped junctions 301-308 of the heat transfer device 208. Each comparator 321-328 is configured to receive, via the buffer 312, the laser diode chip temperature voltage derived from temperature measurements taken by the temperature sensor 106. Also, each comparator 321-328 is configured to receive, from the first look-up module 314, a reference voltage. Also, the comparators 321-328 are configured to receive, from the second look-up module 316, respective control signals.

In operation, if a comparator 321-328 receives an "enable" control signal, that comparator 321-328 compares the laser diode chip temperature voltage received from the buffer 312 to the reference voltage received from the first look-up module 314. The comparator 321-328 then outputs a control signal for adjusting the current through the corresponding row of the heat transfer device 208 so cause the laser diode chip temperature voltage to match (i.e. equal) the reference voltage. The control signals output by the comparators 321-328 are sent from the comparators 321-328 to the differential power supply module 318.

However, if a comparator 321-328 receives a "disable" control signal, that comparator 321-328 is disabled and does not produce an output control signal.

In operation, the differential power supply module 318 receives control signals from one or more of the comparators 321-328. The differential power supply module 318 adjusts the current passing through the rows of the heat transfer device 208 in accordance with the received control signals.

For example, if the differential power supply module 318 receives a control signal from the fourth comparator 324, the differential power supply module 318 causes current to flow through the fourth row 304. The direction of the current through the fourth row 304 is specified by the control signal from the fourth comparator 324 and is dependent upon whether heating or cooling is to be applied to the laser diode chip 102 (i.e. whether the laser diode chip temperature voltage is less than or greater than the reference voltage).

In this embodiment, if the differential power supply module 318 does not receive a control signal from a particular comparator 321-328, no current is applied to the row of P/N-doped junction corresponding to that comparator 321-328. Thus, if a comparator 321-328 receives a "disable" control signal, current is not caused to flow through the row of P/N-doped junctions corresponding to that comparator 321-328. For example, if the ambient temperature measurements are between 0° C. and 40° C., the second look-up module 316 outputs "disable" control signals to the first, second, third, sixth, seventh, and eighth comparators 321-323, 326-328. Thus, those comparators 321-323, 326-328 are disabled, and do not produce an output control signal. Thus, current is not caused to flow through the first, second, third, sixth, seventh, and eighth rows 301-303, 306-308 of the heat transfer device 208.

Thus, in this embodiment, if the ambient temperature in which the further laser transmitter 201 is operating is between 0° C. and 40° C., only those rows overlapped by the footprint 310 of the laser diode chip 102 on the heat transfer device 208 are activated to heat/cool the laser diode chip 102. Similarly, if the ambient temperature in which the further laser transmitter 201 is operating is between −20° C. and 0° C. or between 40° C. and 60° C., only those rows overlapped by the footprint 310, only those rows overlapped by the footprint 310 of the laser diode chip 102 on the heat transfer device 208 and those rows directly adjacent to the rows that are overlapped by the footprint 310 of the laser diode chip 102 on the heat transfer device 208 are activated to heat/cool the laser diode chip 102.

In this embodiment, in the ambient temperature range 0° C. to 20° C., current is applied to the fourth and fifth rows 304, 305 of the heat transfer device 208 in order to heat the laser diode chip 102 to the set temperature of 20° C. At an ambient temperature of 0° C. there may be a larger current flowing through the heat transfer device 208 compared to at higher temperatures. At an ambient temperature of 20° C., the current applied to the heat transfer device 208 may be lower (e.g. reduced to zero), i.e. because the ambient temperature matches the set temperature of 20° C. For different temperatures ranges, one or more of the other rows of P/N doped junctions may be activated until the desired set temperature is obtained. The first lookup module 314 varies the set temperature over the wider ambient temperature range.

Thus, the rows 301-308 of the heat transfer device 208 are controlled by the controller 212 independently from one another so as to control the temperature of the laser diode chip 102. The temperature of the laser diode chip 102 tends to be maintained at the temperature defined by the output of the first lookup module 314.

In this embodiment, each current sensor 331-338 measures a current through a respective row 301-308 of the heat transfer device 208, i.e., the first current sensor 331 measures the current through the first row 301, the second current sensor 332 measures the current through the second row 302, and so on. Measurements taken by the current sensor 331-338 are sent from the current sensor 331-338 to the differential power supply module 318.

The differential power supply module 318 may adapt the currents applied to the heat transfer device 208 based upon the current measurements received from the current sensor 331-338. Say, for example, that the fourth row 304 of the heat transfer device 208 fails (e.g. is damaged) and current is unable to flow through that row 304, the fourth current sensor 304 would send a zero measurement to the differential power supply module 318. If the differential power supply module 318 is applying a current to the fourth row 304, but receives the zero measurement from the fourth current sensor 304, the differential power supply module 318 may determine that the fourth row 304 has failed and may instead control one or more of the other rows 301-303, 305-308 to provide the required heating/cooling effect. Preferably, the differential power supply module 318 controls one or more of the rows adjacent to the failed row (i.e. the third row 303 and/or the fifth row 305) to provide the heating/cooling that should have been provided by the fourth row 304.

As another example, a current measurement taken by current sensors 331-338 may indicate an "over current" (i.e. a current that exceeds a predetermined threshold current) is being applied to the corresponding row 301-308. In response to receiving such a measurement, the differential power supply module 318 may reduce (or limit) the current applied to that row 301-308 so that the applied current is below the threshold value. The differential power supply module 318 may control one or more of the other rows so to provide additional heating/cooling, thereby reducing the burden on row to which over current was being applied.

Advantageously, the above described controller and heat transfer device tend to provide an extended temperature operating range of the laser transmitter compared to temperature operating ranges of conventional optical transmitters. Furthermore, by only selectively activating only certain rows of the heat transfer deice, the power supply consumption of the heat transfer device advantageously tends to be reduced.

The above described controller and multiple row heat transfer device tend to provide that the further laser transmitter has improved power efficiency.

Advantageously, the use of independent rows of P/N doped junctions connected in parallel tends to provide increased reliability. Conventionally, Peltier P/N junctions are connected in series and thus if one P/N-doped junction fails, the entire Peltier cooler fails. This problem tends to be mitigated, at least to some extent, by the above described heat transfer device.

Advantageously, the controller described in more detail above with reference to FIG. 3 comprises current sensing elements corresponding to each of the eight rows of P/N doped junctions. Each current sensing element may be used to determine whether or not the row to which it corresponds has failed. Advantageously, in the event of a row failure, the controller algorithm tends to adapt to implement other rows (e.g. adjacent to the failed row) to compensate for the failed row.

Apparatus, including the differential power supply module and/or other components of the controller, for implementing the above arrangement, and performing any of the above described processes, may be provided by configuring or adapting any suitable apparatus, for example one or more computers or other processing apparatus or processors, and/or providing additional modules. The apparatus may comprise a computer, a network of computers, or one or more processors, for implementing instructions and using data, including instructions and data in the form of a computer program or plurality of computer programs stored in or on a machine readable storage medium such as computer memory, a computer disk, ROM, PROM etc., or any combination of these or other storage media.

In the above embodiments, a single laser diode chip is mounted to the heat transfer device. However, in other embodiments, multiple laser diode chips may be used. Also, in other embodiments, one or more different types of device to be cooled/heated may be mounted to the heat transfer device instead of or in addition to the laser diode chip.

In the above embodiments, the temperature sensor is mounted on the heat transfer device proximate to the laser diode chip. However, in other embodiments, the temperature sensor may be located differently such that the temperature of the laser diode chip, and/or the environment proximate to the laser diode chip, may be measured. For example, in some embodiments, one or more temperature sensors may be mounted directly to the laser diode chip.

In the above embodiments, the heat transfer device comprises eight substantially straight rows of P/N doped junctions. However, in other embodiments, the heat transfer device comprises a different number of rows of P/N doped junctions. Also, in other embodiments, one or more of the rows of P/N doped junctions is non-straight and may meander across the heat transfer device. In some embodiments two or more of the rows of P/N doped junctions may be electrically connected together such that they may be activated simultaneously by the controller.

In the above embodiments, the footprint of the laser diode chip overlaps only the fourth and fifth rows of P/N doped junctions on the upper surface of the heat transfer device. However, in other embodiments, the footprint of the laser diode chip overlaps a different combination of two or more rows of P/N doped junctions. Also, in other embodiments, the footprint of the laser diode chip overlaps only a single row of P/N doped junctions on the upper surface of the heat transfer device.

In the above embodiments, the controller varies the heating or cooling applied to the laser diode chip by selecting and activating particular rows of P/N doped junctions. Also, the currents through the different rows of the heat transfer device may be varied. However, in some embodiments, variable heating or cooling of the laser diode chip may be provided in a different appropriate way.

In the above embodiments, the first lookup module includes a lookup table that specifies the correspondence between ambient temperature measurements and reference voltages described above. However, in other embodiments, the lookup table of the first lookup module specifies different correspondence to those given above.

In the above embodiments, the reference voltage output by the first lookup module may be varied to specify any temperature for the laser diode chip within the range 0° C. to 30° C. However, in other embodiments, reference voltages may specify different temperatures, for example, any temperature for the laser diode chip within a range that that is different to the 0° C. to 30° C. range.

In the above embodiments, the first lookup module and second lookup module each comprise a respective look-up table. Advantageously, the look-up tables replace runtime computation with a simpler array indexing operation, thereby reducing processing time. However, in other embodiments, one or both of the lookup modules uses the ambient temperature measurements taken by the further temperature sensor to calculate or determine outputs in a different appropriate way, for example, using a runtime calculation.

In this embodiment, the look-up table specifies the correspondence between ambient temperature measurements and reference voltages described above. For example, in the above embodiments, the look-up table specifies that ambient temperature measurements of between −40° C. to 80° C. correspond to an output reference voltage that specifies a temperature for the laser diode chip of 20° C. However, in other embodiments, the look-up table specifies different correspondences between ambient temperature measurements and reference voltages.

In the above embodiments, the second lookup module includes a lookup table that specifies the correspondence between ambient temperature measurements and comparator control signals described above. However, in other embodiments, the lookup table of the first lookup module specifies different correspondence to those given above.

In the above embodiments, the controller includes a plurality of current sensors. However, in other embodiments, one or more of the current sensors is omitted.

In the above embodiments, the controller controls the amount of current passing through the heat transfer device, and also selects which rows of the heat transfer device current is to pass through.

However, in other embodiments, the controller only controls the amount of current passing through the heat transfer device and does not select which rows of the heat transfer device current is to pass through. In such embodiments, variable current may be applied to all rows of the heat transfer device equally. Thus, in such embodiments, the second lookup module and comparator control signals may be omitted.

Also, in other embodiments, the controller only selects which rows of the heat transfer device current is to pass through and does not control the amount of current passing through the heat transfer device. In such embodiments, a fixed current may be applied to only the selected rows of the heat transfer device. Thus, in such embodiments, the first lookup module and the reference voltage signals may be omitted.

The invention claimed is:

1. An optical transmitter comprising:
a laser diode for transmitting an optical signal;
a first temperature sensor configured to measure a temperature at or proximate to the laser diode;
a second temperature sensor configured to measure a temperature of an environment in which the optical transmitter is operating;
a thermoelectric device, comprising a plurality of independently controllable heat transfer elements, configured to apply heating or cooling to the laser diode; and a controller configured to, using the temperature measurements taken by the first temperature sensor and the second temperature sensor, control the thermoelectric device to heat or cool the laser diode; further configured to control each of the plurality of heat transfer elements independently of each of the other heat transfer elements.

2. An optical transmitter according to claim 1, wherein the thermoelectric device is a Peltier effect semiconductor heat transfer system.

3. An optical transmitter according to claim 1, wherein the controller is configured to control the thermoelectric device to heat or cool the laser diode based upon a comparison between a first parameter value and a second parameter value, the first parameter value being dependent upon temperature measurements taken by the first temperature sensor, the second parameter value being dependent upon temperature measurements taken by the second temperature sensor.

4. An optical transmitter according to claim 1 further comprising a heat sink coupled to the thermoelectric device and configured to, when the thermoelectric device is controlled to heat the laser diode, draw heat from the environment, and, when the thermoelectric device is controlled to cool the laser diode, dissipate heat into the environment, wherein the second temperature sensor is positioned at or proximate to an interface between the heat sink and the environment.

5. An optical transmitter according to claim 1, wherein the controller includes:
a variable reference signal module configured to generate a first signal, the first signal being dependent upon a temperature measurement taken by the second temperature sensor; and
a comparator configured to compare the first signal to a second signal, the second signal being dependent upon a temperature measurement taken by the first temperature sensor; and
the controller is configured to control the thermoelectric device based upon a comparison between the first signal and the second signal.

6. An optical transmitter according to claim 1, wherein each heat transfer element comprises at least one semiconductor element pair arranged to yield Peltier effect heat transfer, each semiconductor element pair comprising a P-doped semiconductor element and an N-doped semiconductor element.

7. An optical transmitter according to claim 1, wherein the controller is configured to control the heat transfer elements based on a footprint of the laser diode on the thermoelectric device.

8. An optical transmitter according to claim 1, wherein the controller is configured to control the heat transfer elements based on a temperate measurement taken by the second temperature sensor.

9. An optical transmitter according to claim 1, wherein the controller includes
a variable reference signal module configured to generate a first signal, the first signal being dependent upon a temperature measurement taken by the second temperature sensor; and
a plurality of comparators, each comparator being configured to compare the first signal to a second signal, the second signal being dependent upon a temperature measurement taken by the first temperature sensor; and
each comparator is configured to control a respective heat transfer element of the thermoelectric device based upon a comparison between the first signal and the second signal.

10. An optical transmitter according to claim 9, the controller including a comparator activation/deactivation module configured to activate or deactivate the comparators based on a temperate measurement taken by the second temperature sensor.

11. An optical transmitter according to claim 1, further including, for each heat transfer element, a current sensor for measuring a current through that heat transfer element.

12. An optical transmitter according to claim 11, wherein the controller is configured to control the heat transfer elements depending upon measurements taken by one or more of the current sensors.

13. An optical transmitter according to claim 1, further comprising a heat spreader disposed between the laser diode and the thermoelectric device.

14. A method of operating an optical transmitter, the optical transmitter comprising a laser diode for transmitting an optical signal, the method comprising:
measuring, by a first temperature sensor, a temperature at or proximate to the laser diode;
measuring, by a second temperature sensor, a temperature of an environment in which the optical transmitter is operating; and
using the temperature measurements taken by the first temperature sensor and the second temperature sensor, controlling, by a controller, a thermoelectric device, comprising a plurality of independently controllable heat transfer elements, to heat or cool the laser diode; and the controller further controlling each of the plurality of heat transfer elements independently of each other heat transfer elements.

* * * * *